United States Patent
Yang

(10) Patent No.: US 7,339,279 B2
(45) Date of Patent: Mar. 4, 2008

(54) CHIP-SIZE PACKAGE STRUCTURE AND METHOD OF THE SAME

(75) Inventor: Wen Kun Yang, Hsinchu (TW)

(73) Assignee: Advanced Chip Engineering Technology Inc., Hsinchu County (TW)

( * ) Notice: Subject to any disclaimer, the term of this patent is extended or adjusted under 35 U.S.C. 154(b) by 0 days.

(21) Appl. No.: 11/747,417

(22) Filed: May 11, 2007

(65) Prior Publication Data
US 2007/0205494 A1 Sep. 6, 2007

Related U.S. Application Data

(62) Division of application No. 10/973,557, filed on Oct. 26, 2004, now Pat. No. 7,238,602.

(51) Int. Cl.
*H01L 23/48* (2006.01)
(52) U.S. Cl. ........................ 257/778; 257/737
(58) Field of Classification Search ................ 257/737, 257/738, 777; 438/612
See application file for complete search history.

(56) References Cited

U.S. PATENT DOCUMENTS

| | | | |
|---|---|---|---|
| 5,239,198 A | 8/1993 | Lin et al. | 257/693 |
| 5,629,835 A | 5/1997 | Mahulikar et al. | 361/719 |

FOREIGN PATENT DOCUMENTS

TW 177766 9/2003

*Primary Examiner*—Roy Potter
(74) *Attorney, Agent, or Firm*—Kusner & Jaffe

(57) ABSTRACT

The method includes a step of picking and placing standard good dice on a base for obtaining an appropriate and wider distance between dice than the original distance of dice on a wafer. The method of the chip-size package comprises the steps of separating dice on a wafer and picking and placing the dice on a base and filling a first material layer on the base into a space among the dice on the base. A dielectric layer with first openings is patterned to expose a portion of a conductive line of the dice. A conductive material is filled into the first openings and on the dielectric layer. Subsequently, a second material layer is formed to have a second openings exposing the conductive material and then welding solder balls on the second openings.

13 Claims, 4 Drawing Sheets

CHIP-SIZE PACKAGE STRUCTURE AND METHOD OF THE SAME

RELATED APPLICATIONS

This application is a divisional of U.S. application Ser. No. 10/973,557, filed Oct. 26, 2004 now U.S. Pat. No. 7,238,602.

BACKGROUND OF THE INVENTION

1. Field of the Invention

This invention relates to a package for semiconductors, and more particularly to a chip-size package.

2. Description of the Prior Art

The semiconductor technologies are developing very fast, and especially semiconductor dice have a tendency toward miniaturization. However, the requirements for the functions of the semiconductor dice have an opposite tendency to variety. Namely, the semiconductor dice must have more I/O pads into a smaller area, so the density of the pins is raised quickly. It causes the packaging for the semiconductor dice to become more difficult and decrease the yield.

The main purpose of the package structure is to protect the dice from outside damages. Furthermore, the heat generated by the dice must be diffused efficiently through the package structure to ensure the operation the dice.

The earlier lead frame package technology is already not suitable for the advanced semiconductor dice due to the density of the pins thereof is too high. Hence, a new package technology of BGA (Ball Grid Array) has been developed to satisfy the packaging requirement for the advanced semiconductor dice. The BGA package has an advantage of that the spherical terminals has a shorter pitch than that of the lead frame package and the spherical terminals are unlikely to be damage and deform. In addition, the shorter signal transmitting distance benefits to raise the operating frequency to conform to the requirement of faster efficiency. For example, the U.S. Pat. No. 5,629,835 discloses a BGA package, by Mahulikar et al; the U.S. Pat. No. 5,239,198 discloses another package that the FR4 substrates having a pattern of conductive traces thereon are mounted on a PCB; the Taiwan patent No. 177,766 discloses a fan out type WLP, by the inventor of the present invention.

Most of the package technologies divide dice on a wafer into respective dice and then to package and test each individual die respectively. Another package technology, called "Wafer Level Package (WLP)", can package the dice on a wafer before dividing the dice into respective dice. The WLP technology has some advantages, such as a shorter producing cycle time, lower cost, and no need to under-fill or molding.

As aforementioned, the size of the die is very small, and the I/O pads are formed on a surface of a die in the conventional arts. Therefore, number of the pads is limited and a too short pitch among pads results in a problem of signal coupling or signal interface. The solder is also to form a solder bridge easily due to the too short pitch among pads. Moreover, the size of die gradually become smaller and the packaged IC of the die does not have standard size by some package technologies (such as chip size package), but test equipment, package equipment, etc. for some fixed sizes die or packages can not be kept on using. Besides, bad performance of the inter-connection and higher contact resistance of the die and bad thermal conductor of the base will result in reduction or failure of function of the die.

SUMMARY OF THE INVENTION

Therefore, the present invention has been made in view of the above problems in the prior arts, and it is an objective of the present invention to provide a chip-size package structure and a method for manufacturing the same.

Another objective of the present invention is to provide a chip-size package structure to arrive a good thermal conductor owing to silicon backside with metal.

Still another objective of the present invention is to reduce the contact resistance of the chip-size package structure.

Another objective of the present invention is to lower the cost of the package structure.

Still another objective of the present invention is to raise the yield and reliability of the package structure.

Another objective of the present invention is to provide package structure with a super thin package thickness (less than 400 μm).

As aforementioned, the present invention provides a process of chip-size package. First, a first contact conductive layer is formed on a processed silicon wafer having a plurality of dice with pads formed thereon. A first photo resist layer is formed on the first contact conductive layer. Then, the first photo resist layer is patterned on the first contact conductive layer. The first contact conductive layer is etched to form first conductive lines to cover the pads. Remaining first photo resist layer is removed. Next, a first dielectric layer is formed on the first conductive lines and the processed silicon wafer. The first dielectric layer is photo/etch patterned to form first openings on the first conductive lines. Then, the processed silicon wafer is diced to separate the plurality of dice. The good dice are picked and adhered from the plurality of dice on a base. The good dice and the base are cured. Next, a first material layer is formed on the base to fill in a space among the plurality of dice on the base. The first material layer is cured. A second dielectric layer is formed on the first material layer to fill in the first openings on the first conductive lines. A partial region of the second dielectric layer is removed to form second openings on the first conductive lines, wherein the second openings are substantially the same with the first openings. A second contact conductive layer is formed on the second dielectric layer to fill in the second openings on the first conductive lines. A second photo resist layer is formed to form second conductive lines being coupled with the first conductive lines. A second material layer is formed on the second conductive lines and the second dielectric layer. A second photo resist layer is removed to form second conductive lines. Then, the second material layer is photo/etch patterned to form third openings on the second conductive lines. Next, solder balls are welded on the third openings. Finally, the base is cut to form single chip-size packages.

The present invention also provides a chip-size package structure. The package structure comprises a base, a die, first conductive lines, a first dielectric layer, a first material layer, a second dielectric layer, second conductive lines, a second material layer and solders balls. The die with pads is adhered to the base. The first conductive lines are formed on the die to cover the pads. A first dielectric layer is formed on the die and the first conductive lines, and the first dielectric layer has first openings on the first conductive lines. A first material layer is formed on the base and filled in a space except the die on the base. A second dielectric layer is formed on the first dielectric layer and the first material layer, and the second dielectric layer has second openings on the first conductive lines, wherein the second openings are substantially the same with the first openings. The second conductive lines are formed on the first openings and the second openings to electrically couple with the first conductive lines, respectively. A second material layer is formed on the second conductive lines and the second dielectric layer, and the second material layer has third openings on the second conductive lines. The solder balls are welded on the third openings and electrically coupling with the second conductive lines, respectively. The first dielectric layer and said first material layer are substantially at the same level.

DESCRIPTION OF THE PREFERRED EMBODIMENT

Some sample embodiments of the present invention will now be described in greater detail. Nevertheless, it should be recognized that the present invention can be practiced in a wide range of other embodiments besides those explicitly described, and the scope of the present invention is expressly not limited expect as specified in the accompanying claims.

Then, the components of the different elements are not shown to scale. Some dimensions of the related components are exaggerated and meaningless portions are not drawn to provide a more clear description and comprehension of the present invention.

The present invention includes a step of picking and placing standard dice on an additional base for obtaining an appropriate and wider distance between dice than the original distance of dice on a wafer. Therefore, the package structure has a larger size of balls array than the size of the die to avoid the short pitch problem between balls. The method includes a step of picking and placing standard good dice on a base for obtaining an appropriate and wider distance between dice than the original distance of dice on a wafer. The method of the chip-size package comprises the steps of separating dice on a wafer and picking and placing the dice on a base and filling a first material layer on the base into a space among the dice on the base. A dielectric layer with first openings is patterned to expose a portion of a conductive line of the dice. A conductive material is filled into the first openings and on the dielectric layer. Subsequently, a second material layer is formed to have a second openings exposing the conductive material and then welding solder balls on the second openings.

The detailed process of the present invention will be described below.

A processed silicon wafer with dice is put on a base and then the thickness of the processed silicon wafer is decreased by back lapping to get a thickness range of 50-300 μm. The processed silicon wafer with the aforementioned thickness is easily sawed to divide the dice on the wafer into respective dice. The back lapping step may be omitted if the processed silicon wafer is not hard to saw without back lapping. A dielectric layer (protection layer) is optionally formed on the processed silicon wafer before sawing to protect dice form damages.

Figure 1:
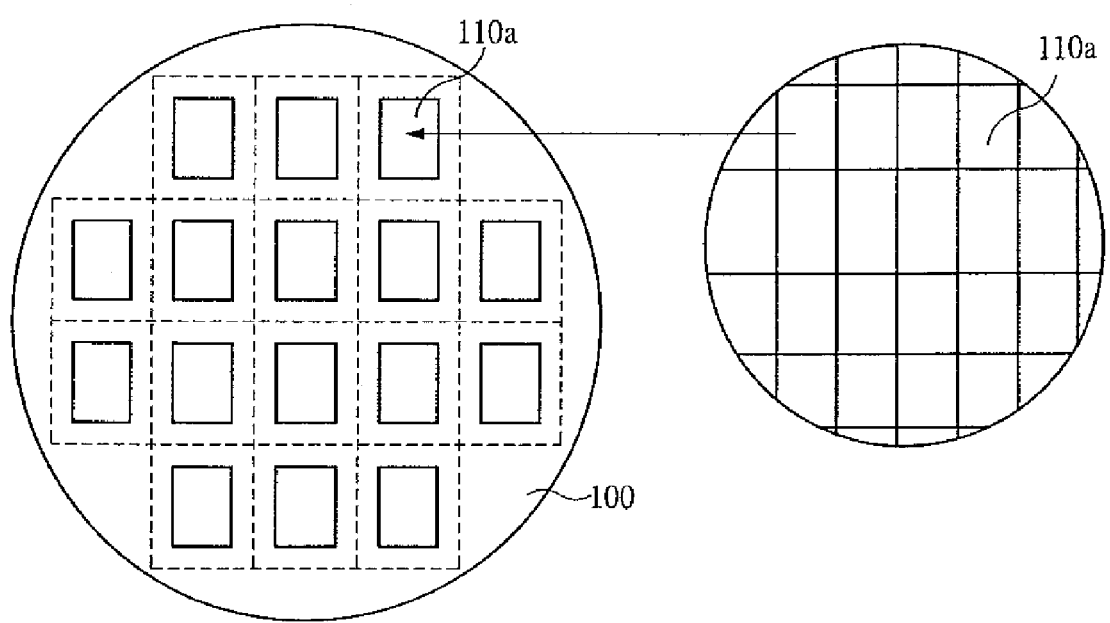
FIG. 1 is schematic diagram of using pick & place to replace standard dice onto a new base according to the present invention.

Each individual and divided dice 110a on a wafer are tested, followed by choosing the standard good dice form the tested dice on the wafer. The standard good dice 110a are picked and replaced onto an additional base 100 with a wider distance between two adjacent dice and adhered to the base 100 with an UV curing type and/or heat curing type adhesion material with good thermal conductivity (not shown), as shown in FIG. 1. The adhesion material is coating on the base 100. When the dice 110a are placed on the adhesion material, the adhesion material is cured by UV light or thermal. The distance between two adjacent dice on the base 100 is arranged wider to have enough space for forming fan out ball array in later steps. Hence, the present invention can maintain an ideal or optimize ball pitch for avoiding problems of signal coupling and signal interference and increase the number of I/O ports (balls), even the size of dice becomes smaller. The material of the base 100 can be glass, silicon, ceramic, crystal materials, metal, etc. and even have a round or a rectangular shape. In the present invention, the number of dice is not limited. More than three dice can be packaged in the same package structure by the present invention. The adhesive material of the present invention is preferably good thermal conductive material, so the problems (such as stress) resulted from the temperature difference between the dice 110a and the base 100 can be avoided.

The illustration and the corresponding figure below are made through single die to simplify and provide a more clear description comprehension of the present invention.

Figure 2:
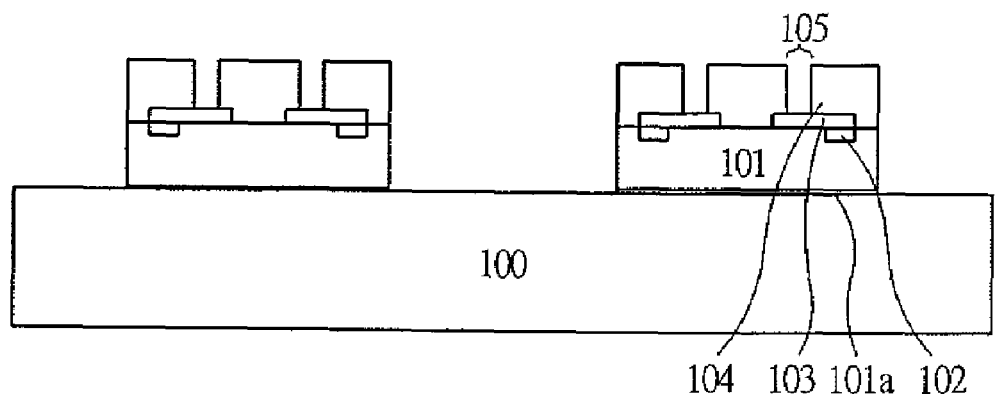
FIG. 2 is a schematic lateral view diagram of picking and adhering the good dice from the plurality of dice on the base according to the present invention.

Before achieving the result of FIG. 2, a plasma etching (RIE) can be used optionally to clean the surface of the processed wafer to make sure no residual materials on the wafer. Next, a first contact conductive layer 103 is formed on the wafer with pads 102 formed therein. A first photo resist layer is formed on the first contact conductive layer 103. The first contact conductive layer can be formed by a physical method, a chemical method, or the combination thereof, for example: CVD, PVD, sputter, and electroplating. The first contact conductive layer 103 comprises Al or Ti, Cu, and the combination thereof. The thickness of the first contact conductive layer 103 is preferably 1~2 μm. Then, the first photo resist layer (not shown) is patterned on the first contact conductive layer 103. The first contact conductive layer 103 is etched to form first conductive lines to cover the pads 102. Remaining first photo resist layer is removed. Next, a first dielectric layer 104 is formed on the first conductive lines 103 and the die 101. The first dielectric layer 104 comprises BCB, SINR, and the combination thereof. The thickness of the first isolation layer 104 is preferably 2~5 μm. The first dielectric layer 104 is photo/etch to form first openings on the first conductive lines. After the formation of the first conductive lines and first dielectric layer, the good dice and the wafer are cured. The back lapping of the wafer can be used optionally to achieve a predetermined thickness around 50-300 μm before the step of separating the dice. As shown in FIG. 1, the good die is picked and placed on the base 100 in FIG. 1. After above steps are performed, the result of FIG. 2 is achieved.

FIG. 2 is a schematic lateral view diagram of picking and adhering the good dice 101 from the plurality of dice on a base 100 according to the present invention. As aforementioned, the first conductive lines 103 are formed on the die 101 to cover the pads 102. A first dielectric layer 104 is formed on the die 101 and the first conductive lines 103, and the first dielectric layer 104 has first openings 105 on the first conductive lines 103. The die 101 with pads 102 is adhered to the base 100 with an UV curing type and/or heat curing type adhesion material 101a with good thermal conductivity. The first dielectric layer 104 having first openings 105 is formed on the first conductive lines 103 and the processed silicon wafer by using a photolithography method of the first dielectric layer. The good die 101 is formed by sawing the processed silicon wafer. The good dice 101 are adhered on the base 100. The good dice 101 and the base 100 are then cured. The base 100 comprises metal or glass, wherein the metal comprises Fe, Co, Ni, and the combination thereof, for example commercial name of Alloy 42, and thickness of the alloy is preferably about 200-300 μm. If glass is used, the thickness of the glass is preferably about 200-400 μm.

Figure 3:
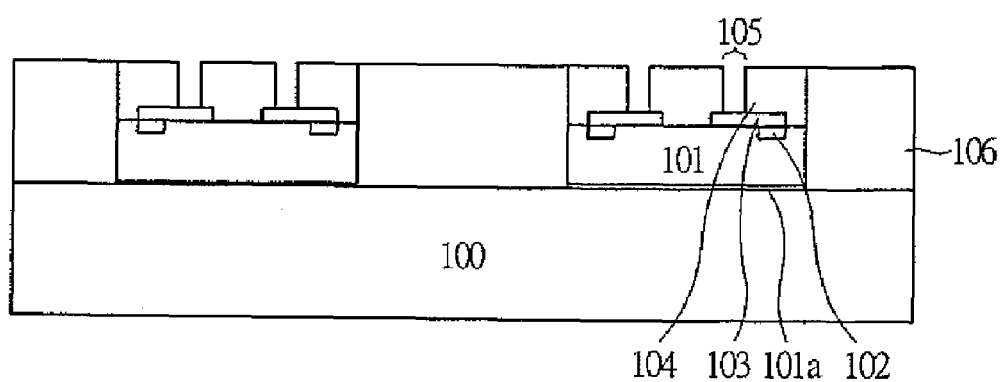
FIG. 3 is a schematic lateral view diagram of forming a first material layer on the base to fill in a space among the plurality of dice on the base according to the present invention.

FIG. 3 is a schematic lateral view diagram of forming a first material layer on the base 100 to fill in a space among the plurality of dice 101 on the base 100 according to the present invention. First material layer 106 is formed on the base 100 to fill in a space (scribe line) among the plurality of dice 101, and the surface of the first material layer 106 and the surface of the first dielectric layer 104 are substantially at the same level. The material of the first material layer 106 can be UV curing type or heating curing type material. Then, the first material layer 106 is cured by UV or thermal. The first material layer 106 may be formed by a screen vacuum printing method or a photolithography method. The first material layer 106 functions as a buffer layer to reduce a stress due to temperature, etc. The first material layer 106 can be a UV and/or heat curing material, such as silicon rubber, epoxy, resin, SINR, PI or BCB formed by a vacuum printing method and/or a photolithography method, and so on. The thickness of the first material layer is same as the thickness of dice.

Figure 4:
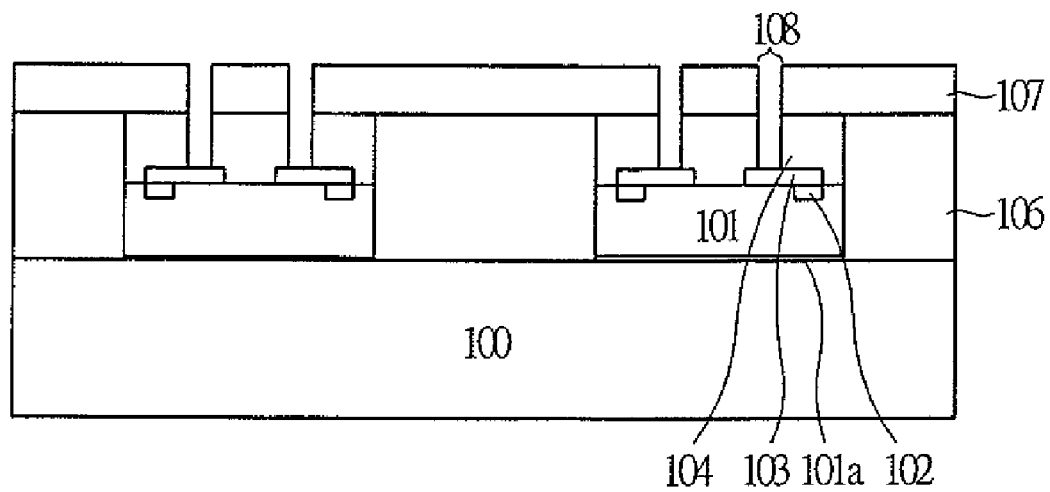
FIG. 4 is a schematic lateral view diagram of removing a partial region of the second dielectric layer to form second openings on the first conductive lines according to the present invention.

As shown in FIG. 4, a second dielectric layer 107 is formed on the first material layer 106 to fill in the first openings 105 on the first conductive lines 103. Next, a partial region of the second dielectric layer 107 is removed to form second openings 108 therein on the first conductive lines 103, wherein the second openings 108 are substantially the same with the first openings 105. The second dielectric layer is preferably SINR, BCB, silicon rubber formed by a printing or coating method, and the thickness of the second dielectric layer is preferably about 2~8 μm. The step of removing a partial region of the second dielectric layer is performed by a laser trimming method or a photolithography method. Then, the plasma etching (RIE) can be used optionally to clean the surface of the first conductive lines 103 after the step of the removing a partial region of the second isolation layer 107 through the openings 108 to make sure no residual materials on the first conductive lines 103. Next, a Chemical plating Cu or sputtering Ti/Cu can be used optionally to form a thin metal layer (not shown) on the surface of the first conductive lines 103.

Figure 5:
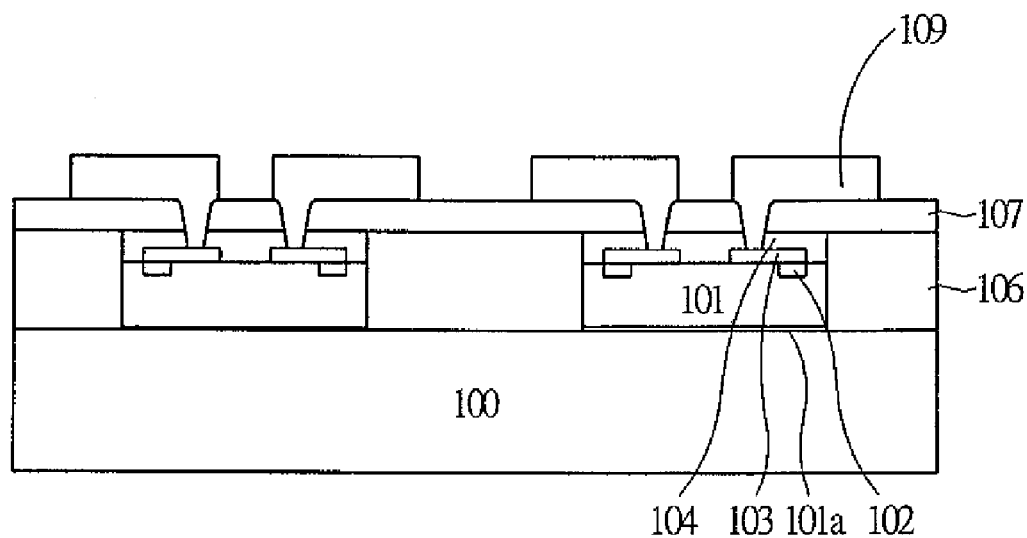
FIG. 5 is a schematic lateral view diagram of forming second conductive lines being coupled with said first conductive lines, respectively according to the present invention.

Then, a second photo resist layer (not shown) is formed on the second dielectric layer 107 and the first conductive lines 103. The second photo resist layer is patterned on the thin metal layer (not shown). A second contact conductive layer is formed on the second dielectric layer 107 to fill in the second openings 108 on the first conductive lines 103. The second contact conductive layer 109 can be formed by electroplating. The second contact conductive layer 109 comprises Ni, Cu, Au, and the combination thereof. The thickness of the second contact conductive layer 109 is preferably 12~18 μm. Next, the second photo resist layer is removed to form second conductive lines 109 being coupled with the first conductive lines 103, as shown in FIG. 5.

Figure 6:
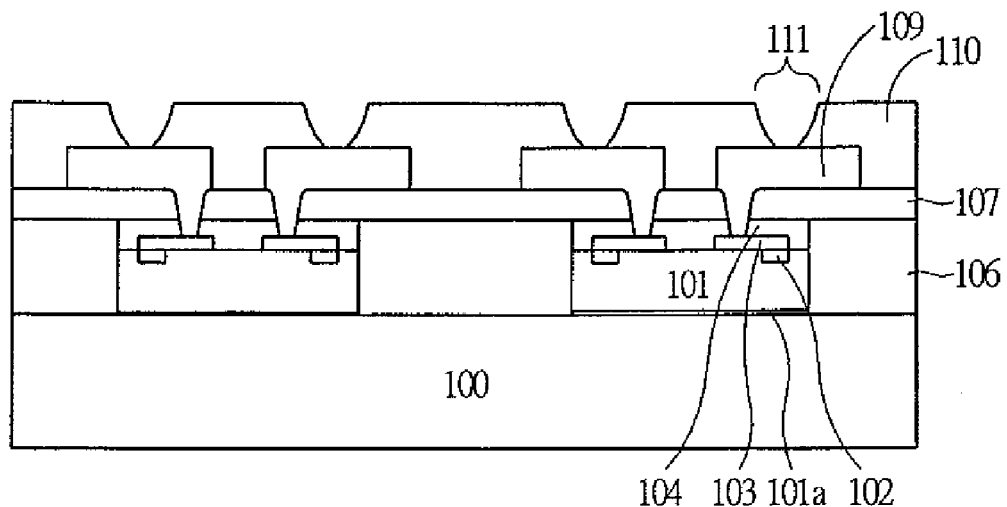
FIG. 6 is a schematic lateral view diagram of forming second material layer having third openings on the second conductive lines according to the present invention.

Referring to FIG. 6, a second material layer is formed on the second conductive lines 109 and the second dielectric layer 107. The second material layer 110 is formed by a printing or coating method. The second material layer 110 comprises a material of commercial name of Solder Mask (epoxy), SINR, BCB, with a thickness around 20~25 μm, and the combination thereof. Then, the second material layer 110 is photo/etch to form third openings 111 in the second material layer 110 thereby exposing the second conductive lines 109. Subsequently, the plasma etching (RIE) can be used to optionally clean the surface of the second conductive lines 109.

Figure 7:
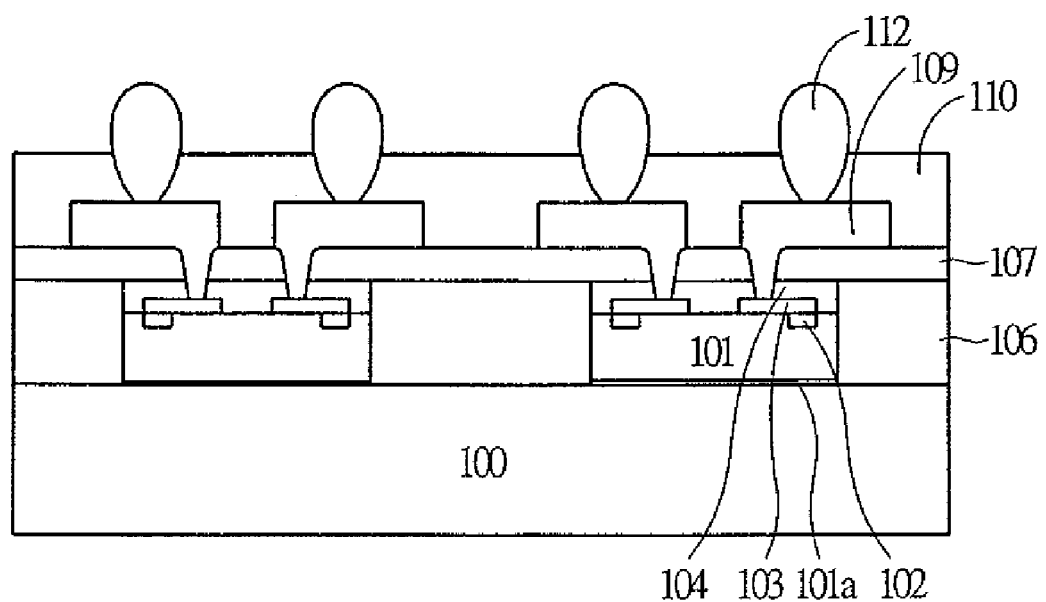
FIG. 7 is a schematic lateral view diagram of forming solder balls on the third openings according to the present invention.

Referring to FIG. 7, solder balls 112 are placed onto the solder openings 111 by a stencil printing method. Then, the solder balls 112 are joined together with surfaces of the second conductive lines 109 by an IR re-flow method.

Next, the processed base 100 can be cut to several chip-size dice pieces for FT (Final Testing) and BI (Burn In) after the step of the welding the solder balls 112 on the third openings 111. Subsequently, a step of laser marking may be made after the step of said FT (Final Testing).

Final, the packaged base 100 with the aforementioned structure is sawed along the sawing line (not shown) to form single chip-size packages.

Furthermore, a step of pick-and-place the chip-size package into a tray may be made for SMT (Surface Mounting Technique) process after the step of the cutting the packaged base 100 to form single chip-size packages.

Hence, according to the present invention, the aforementioned package structure can provide a chip-size package structure with a super thin package thickness (less than 400 μm) to arrive a good thermal conductor owing to silicon backside with metal. Therefore, the present invention can raise the yield, reliability and reduce the contact resistance of the package structure. Moreover, the chip-size package structure of the present invention can lower the cost of the package structure.

Although specific embodiments have been illustrated and described, it will be obvious to those skilled in the art that various modifications may be made without departing from what is intended to be limited solely by the appended claims.

What is claimed is:

1. A chip-size package structure, comprising:
   a base;
   a die with pads adhered to said base;
   first conductive lines formed on said die to cover said pads;
   a first dielectric layer formed on said die and said first conductive lines, and said first dielectric layer having first openings on said first conductive lines;
   a first material layer formed on said base and filled in a space between said dice on said base;
   a second dielectric layer formed on said first dielectric layer and said first material layer, and said second dielectric layer having second openings on said first conductive lines;

second conductive lines formed on said first openings and said second openings to electrically couple with said first conductive lines, respectively;

a second material layer formed on said second conductive lines and said second dielectric layer, and said second material layer having third openings on said second conductive lines; and solder balls welded on said third openings and electrically coupling with said second conductive lines, respectively.

2. The package structure in claim 1, wherein surfaces of said first dielectric layer and said first material layer are substantially at same level.

3. The package structure in claim 1, wherein said die is formed by sawing a processed base.

4. The package structure in claim 3, wherein said processed base is back lapped to get a thickness of said processed base around 200-400 μm.

5. The package structure in claim 1, wherein materials of said first material layer and said second material layer comprise UV curing type material or heat curing type material.

6. The package structure in claim 5, wherein said first material layer comprises silicon rubber, SINR, BCB or epoxy.

7. The package structure in claim 5, wherein said second material layer comprises SINR, BCB, Solder mask (Epoxy).

8. The package structure in claim 1, wherein said first conductive lines comprise Al, Ti, Cu, and the combination thereof.

9. The package structure in claim 1, wherein said second conductive lines comprise Ti, Ni, Cu, Au, and the combination thereof.

10. The package structure in claim 1, wherein said base comprises metal, alloy 42 (42Ni58Fe) or glass.

11. The package structure in claim 10, wherein said metal comprises Fe, Co, Ni, and the combination thereof, and thickness of said metal is about 200-300 μm.

12. The package structure in claim 1, wherein said first dielectric layer comprises BCB, SINR, PI or silicon rubber.

13. The package structure in claim 1, wherein said second dielectric layer is silicon rubber, SINR, BCB.

* * * * *